United States Patent
Hiramitsu

(10) Patent No.: US 10,720,383 B2
(45) Date of Patent: Jul. 21, 2020

(54) SEMICONDUCTOR DEVICE CONFIGURING UPPER AND LOWER ARMS INCLUDING AUXILIARY TERMINALS

(71) Applicant: DENSO CORPORATION, Kariya, Aichi-pref. (JP)

(72) Inventor: Shinji Hiramitsu, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/505,812

(22) Filed: Jul. 9, 2019

(65) Prior Publication Data

US 2019/0333843 A1 Oct. 31, 2019

Related U.S. Application Data

(63) Continuation of application No. PCT/JP2017/040517, filed on Nov. 10, 2017.

(30) Foreign Application Priority Data

Jan. 16, 2017 (JP) .................... 2017-005384

(51) Int. Cl.
| | |
|---|---|
| *H01L 23/495* | (2006.01) |
| *H01L 23/31* | (2006.01) |
| *H01L 23/433* | (2006.01) |
| *H02M 7/48* | (2007.01) |
| *H02M 7/483* | (2007.01) |

(52) U.S. Cl.
CPC .... *H01L 23/49568* (2013.01); *H01L 23/3114* (2013.01); *H01L 23/4334* (2013.01); *H01L 23/49513* (2013.01); *H01L 23/49562* (2013.01); *H01L 23/49575* (2013.01); *H02M 7/48* (2013.01); *H02M 2007/4835* (2013.01)

(58) Field of Classification Search
CPC ......... H01L 23/49575; H01L 23/49537; H01L 23/49568; H01L 23/36
See application file for complete search history.

(56) References Cited

U.S. PATENT DOCUMENTS

| | | | | |
|---|---|---|---|---|
| 2012/0001308 | A1* | 1/2012 | Fukutani | H01L 23/49524 257/675 |
| 2014/0264819 | A1* | 9/2014 | Okumura | H01L 23/3672 257/712 |
| 2016/0218047 | A1* | 7/2016 | Okumura | H01L 25/07 |
| 2016/0315037 | A1* | 10/2016 | Kadoguchi | H01L 23/49562 |

(Continued)

*Primary Examiner* — Nelson Garces
(74) *Attorney, Agent, or Firm* — Posz Law Group, PLC

(57) ABSTRACT

In a semiconductor device, a first semiconductor chip and a second semiconductor chip are aligned in a direction orthogonal to a plate thickness direction of the first semiconductor chip. A pair of first heat sinks is disposed on opposite sides of the first semiconductor chip in the first direction, and a pair of second heat sinks disposed on opposite sides of the second semiconductor chip in the first direction. The semiconductor chips and the heat sinks are sealed in a resin molded body. A plurality of main terminals are aligned in the second direction and project from a same side surface of a resin molded body. The main terminals includes a positive electrode terminal, a negative electrode terminal, an output terminal, and an auxiliary terminal. The first relay members are disposed in the resin molded body, and electrically connecting the main terminals and the corresponding heat sinks.

7 Claims, 9 Drawing Sheets

(56) References Cited

U.S. PATENT DOCUMENTS

2016/0336251 A1* 11/2016 Fukuoka ............. H01L 27/0664
2017/0103962 A1*  4/2017 Oomae ................ H01L 24/34
2017/0317006 A1   11/2017 Okumura

* cited by examiner

US 10,720,383 B2

SEMICONDUCTOR DEVICE CONFIGURING UPPER AND LOWER ARMS INCLUDING AUXILIARY TERMINALS

CROSS REFERENCE TO RELATED APPLICATIONS

The present application is a continuation application of International Patent Application No. PCT/JP2017/040517 filed on Nov. 10, 2017, which designated the U.S. and claims the benefit of priority from Japanese Patent Application No. 2017-5384 filed on Jan. 16, 2017. The entire disclosures of all of the above applications are incorporated herein by reference.

TECHNICAL FIELD

The present disclosure relates to a semiconductor device configuring upper and lower arms.

BACKGROUND

For example, a semiconductor device configures an upper and lower arm including an upper arm and a lower arm, and the upper and lower arm is electrically connected to a smoothing capacitor.

The semiconductor device configuring the upper and lower arm may include, for example, a first semiconductor chip (IGBT element) formed with a switching element of the upper arm, and a second semiconductor chip (IGBT element) formed with a switching element of the lower arm. The first semiconductor chip and the second semiconductor chip are aligned in a second direction orthogonal to a first direction that is a plate thickness direction of the first semiconductor chip. The first semiconductor chip is disposed between a pair of first heat sinks, and the second semiconductor chip is disposed between a pair of second heat sinks. The semiconductor chips and the heat sinks are integrally sealed with a resin molded body (resin portion).

The semiconductor device may include, as main terminals, a positive electrode terminal (high potential power supply terminal) electrically connected to the first heat sink on a high potential side, a negative electrode terminal (low potential power supply terminal) connected to the second heat sink on a low potential side, and an output terminal connected to either the first heat sink on the low potential side or the second heat sink on the high potential side. Those main terminals may be aligned in the second direction, and project from the same side surface of the resin molded body.

SUMMARY

The present disclosure describes a semiconductor device including a plurality of semiconductor chips, a plurality of heat sinks, a resin molded body, a plurality of main terminals, a plurality of first relay members. The plurality of semiconductor chips includes a first semiconductor chip and a second semiconductor chip aligned in a second direction that is orthogonal to a first direction corresponding to a thickness direction of the first semiconductor chip. The plurality of heat sinks includes a pair of first heat sinks disposed on opposite sides of the first semiconductor chip in the first direction, and a pair of second heat sinks disposed on opposite sides of the second semiconductor chip in the first direction. The plurality of main terminals are aligned in the second direction and project from a same side surface of the resin molded body. The main terminals includes a positive electrode terminal, a negative electrode terminal, an output terminal, and an auxiliary terminal. The first relay members are disposed in the resin molded body, and electrically connecting the main terminals and the corresponding heat sinks.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
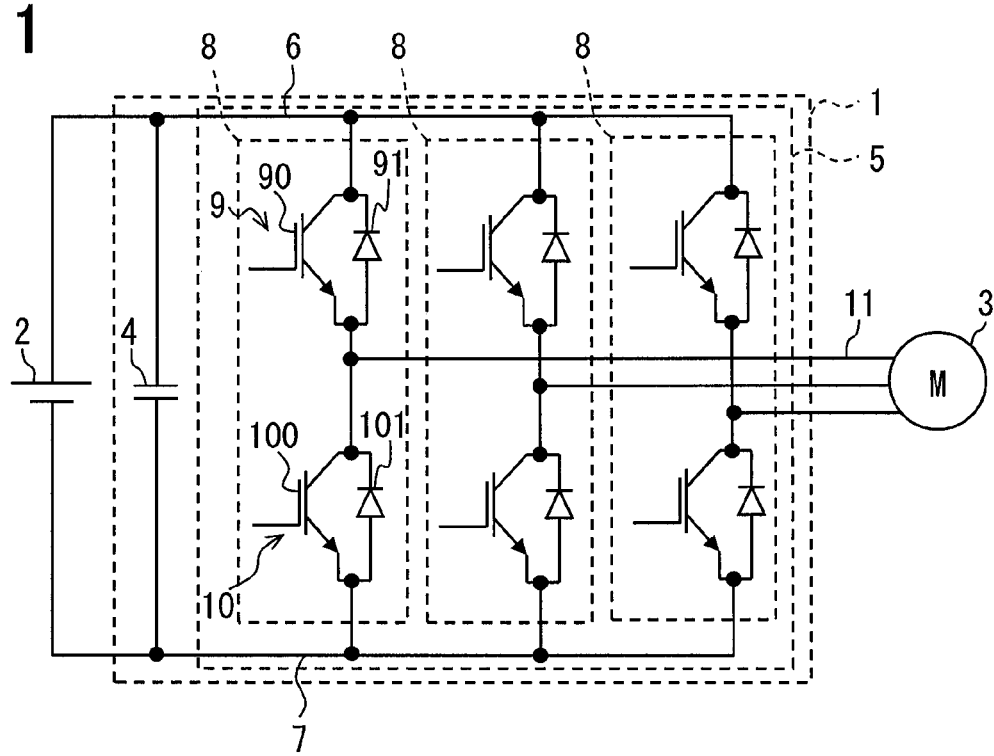
FIG. 1 is an equivalent circuit diagram showing a power conversion device employing a semiconductor device according to a first embodiment.

In a semiconductor device configuring an upper and lower arm, as main terminals, a positive electrode terminal, a negative electrode terminal, and an output terminal may project from the same side surface of a resin molded body, and such main terminals may be aligned in a direction in which a first semiconductor chip of the upper arm and a second semiconductor chip of the lower arm are aligned.

In a case where at least a part of main terminals is formed so as to integrally connect to a corresponding heat sink, the degree of freedom of the arrangement of the main terminals may be low. In addition, when the arrangement of the main terminals is changed in accordance with a design change, such as a capacitance change of a smoothing capacitor, a position of holding the main terminals in a molding die for forming the resin molded body may be changed. As a result, the molding die may need to be also changed.

According to a first aspect of the present disclosure, a semiconductor device, which configures an upper and lower arm having an upper arm and a lower arm connected in series and is to be electrically connected to a smoothing capacitor, includes a plurality of semiconductor chips, a plurality of heat sinks, a resin molded body, a plurality of main terminals, a plurality of first relay members, and a second relay member.

The plurality of semiconductor chips include a first semiconductor chip and a second semiconductor chip. The first semiconductor chip is formed with a switching element of the upper arm, and has first main electrodes on both sides in a first direction, which corresponds to a plate thickness direction of the first semiconductor chip. The second semiconductor chip is formed with a switching element of the lower arm, and has second main electrodes on both sides in the first direction. The first semiconductor chip and the second semiconductor chip are aligned in a second direction orthogonal to the first direction. The plurality of heat sinks include a pair of first heat sinks and a pair of second heat sinks. The pair of first heat sinks are disposed on opposite sides of the first semiconductor chip in the first direction, and electrically connected to the corresponding first main electrodes. The pair of second heat sinks are disposed on opposite sides of the second semiconductor chip in the first direction, and electrically connected to the corresponding second main electrodes. The resin molded body integrally seals the plurality of semiconductor chips and the plurality of heat sinks. The plurality of main terminals are aligned side by side in the second direction while projecting from the same side surface of the resin molded body. The plurality of main terminals include a positive electrode terminal connected to the first heat sink on a high potential side, a negative electrode terminal connected to the second heat sink on a low potential side, an output terminal connected to one of the first heat sink on a low potential side and the second heat sink on a high potential side, and at least one auxiliary terminal. The plurality of first relay members are disposed in the resin molded body, and electrically relay the main terminals and the corresponding heat sinks. The second relay member is disposed in the resin molded body, and electrically relays any one of the positive electrode terminal, the negative electrode terminal, and the output terminal to the auxiliary terminal.

Further, in the semiconductor device, the first heat sink on low potential side and the second heat sink on high potential side are electrically connected to each other. A part of the main terminals, that is, a part of the positive electrode terminal, the negative electrode terminal, and the output terminal is connected to the corresponding heat sink through the first relay member, the auxiliary terminal, and the second relay member, and the remaining main terminals are connected to the corresponding heat sinks through the first relay members without passing through the auxiliary terminal.

In such a configuration, of the main terminals aligned in the second direction, the arrangement order of the positive electrode terminal, the negative electrode terminal, and the output terminal can be freely set by means of the auxiliary terminal, the first relay member, and the second relay member. In other words, the degree of freedom of arrangement of the main terminals can be improved.

In addition, the arrangement order of the positive electrode terminal, the negative electrode terminal, and the output terminal can be changed without changing the alignment of the plural main terminals, but by simply changing connection targets of the first relay members and the second relay member. For example, if the capacitance of the smoothing capacitor is changed, the arrangement order of the positive electrode terminal, the negative electrode terminal, and the output terminal may need to be changed. Even in such a situation, it is not necessary to change the alignment of the plural main terminals including the auxiliary terminal. Therefore, the same molding die as before the change can be used.

According to a second aspect of the present disclosure, a semiconductor device, which configures an upper and lower arm having an upper arm and a lower arm connected in series and is to be electrically connected to a smoothing capacitor, includes a plurality of semiconductor chips, a plurality of heat sinks, a resin molded body, a plurality of main terminals, a plurality of first relay members.

The plurality of semiconductor chips include a first semiconductor chip and a second semiconductor chip. The first semiconductor chip is formed with a switching element of the upper arm, and has first main electrodes on both sides in a first direction, which corresponds to a plate thickness direction of the first semiconductor chip. The second semiconductor chip is formed with a switching element of the lower arm, and has second main electrodes on both sides in the first direction. The first semiconductor chip and the second semiconductor chip are aligned in a second direction orthogonal to the first direction. The plurality of heat sinks include a pair of first heat sinks and a pair of second heat sinks. The pair of first heat sinks are disposed on opposite sides of the first semiconductor chip in the first direction and electrically connected to the corresponding first main electrodes. The pair of second heat sinks are disposed on opposite sides of the second semiconductor chip in the firsts direction and electrically connected to the corresponding second main electrodes. The resin molded body integrally seals the plurality of semiconductor chips and the plurality of heat sinks. The plurality of main terminals are aligned side by side in the second direction while projecting from the same side surface of the resin molded body. The plurality of main terminals include a positive electrode terminal connected to the first heat sink on a high potential side, a negative electrode terminal connected to the second heat sink on a low potential side, an output terminal connected to one of the first heat sink on a low potential side and the second heat sink on a high potential side, and at least one auxiliary terminal. The plurality of first relay members are disposed in the resin molded body, and electrically relay the main terminals and the corresponding heat sinks.

Further, in the semiconductor device, the first heat sink on the low potential side and the second heat sink on the high potential side are electrically connected to each other. The negative electrode terminal is disposed adjacent to the positive electrode terminal in the second direction. The output terminal is connected to the corresponding heat sink through the first relay member. In a case where at least one of the positive electrode terminal and the negative electrode terminal is located farther than the auxiliary terminal from the corresponding heat sink in a plan view viewed in the first direction, the at least one located farther than the auxiliary terminal is connected to the corresponding heat sink through the first relay member and the auxiliary terminal. In a case where a distance between the positive electrode terminal and the corresponding heat sink and a distance between the negative electrode terminal and the corresponding heat sink are each equal to or less than a distance between the auxiliary terminal and the respective corresponding heat sink, the positive electrode terminal and the negative electrode terminal are connected to the corresponding heat sinks through the first relay members without through the auxiliary terminal.

Also in such a configuration, the same effects as those described above can be achieved.

Hereinafter, embodiments of the present disclosure will be further described with reference to the drawings. In multiple embodiments, functionally and/or structurally corresponding parts are denoted by the same reference numerals. In the following description, a plate thickness direction of a semiconductor chip is indicated by a Z-direction, and an alignment direction of the two semiconductor chips, which is orthogonal to the Z-direction, is indicated by an X-direction. A direction orthogonal to both the Z-direction and the X-direction is denoted as a Y-direction. Unless otherwise specified, a shape along an XY plane defined by the X-direction and the Y-direction is referred to as a planar shape. The Z-direction corresponds to a first direction, and the X-direction corresponds to a second direction.

First Embodiment

First, a power conversion device employing a semiconductor device will be described with reference to FIG. 1.

A power conversion device 1 shown in FIG. 1 is mounted on, for example, an electric vehicle or a hybrid vehicle. The power conversion device 1 is configured to convert a DC voltage supplied from a battery 2, which is a DC power supply mounted on a vehicle, into a three-phase AC voltage, and output the three-phase AC voltage to a motor 3 of a three-phase AC system. The motor 3 functions as a travel driving source of the vehicle. The power conversion device 1 can also convert an electric power generated by the motor 3 into a direct current and charge the battery 2. In this manner, the power conversion device 1 is capable of performing a bidirectional power conversion.

The power conversion device 1 includes a smoothing capacitor 4 and an inverter 5. A positive electrode terminal of the smoothing capacitor 4 is connected to a positive electrode which is an electrode on the high potential side of the battery 2, and a negative electrode terminal of the smoothing capacitor 4 is connected to a negative electrode which is an electrode on a low potential side of the battery 2. The inverter 5 converts the input DC power into a three-phase AC having a predetermined frequency, and outputs the converted three-phase AC to the motor 3. Further, the AC power generated by the motor 3 is converted into a DC power.

The inverter 5 has three phases of upper and lower arms 8 provided between a high potential power supply line 6 and a low potential power supply line 7. Each of the upper and lower arms 8 is a series circuit of an upper arm 9 and a lower arm 10. A high potential power supply line 6 is connected to a positive electrode terminal of the smoothing capacitor 4, and the low potential power supply line 7 is connected to a negative electrode terminal of the smoothing capacitor 4. In the present embodiment, insulated gate bipolar transistors (hereinafter each referred to as IGBT) are employed as the switching elements configuring the upper and lower arm 8.

The upper arm 9 includes an IGBT 90 and a reflux diode 91 connected in anti-parallel to the IGBT 90. In the present embodiment, an n-channel type IGBT 90 is employed, and a collector electrode of the IGBT 90 and a cathode electrode of the diode 91 are electrically connected to the high potential power supply line 6.

The lower arm 10 has an IGBT 100 and a reflux diode 101 connected in anti-parallel to the IGBT 100. According to the present embodiment, an n-channel type IGBT 100 is employed, and an emitter electrode of the IGBT 100 and an anode electrode of the diode 101 are electrically connected to the low potential power supply line 7.

A collector electrode of the IGBT 100 and a cathode electrode of the diode 101 are electrically connected to an emitter electrode of the IGBT 90 and an anode electrode of the diode 91. A connection point between the emitter electrode of the IGBT 90 and the collector electrode of the IGBT 100, that is, a connection point between the upper arm 9 and the lower arm 10, is electrically connected to the output line 11 toward the motor 3.

In addition to the inverter 5 described above, the power conversion device 1 has a drive circuit for controlling the operation of the inverter 5. The power conversion device 1 described above is also referred to as a (power control unit) (PCU). The power conversion device 1 may further include an inverter corresponding to a motor different from the motor 3, a boost converter for boosting a DC voltage supplied from the battery 2, and the like.

Next, a semiconductor device configuring the above-described upper and lower arm 8 will be described with reference to FIGS. 2 to 4.

Figure 2:
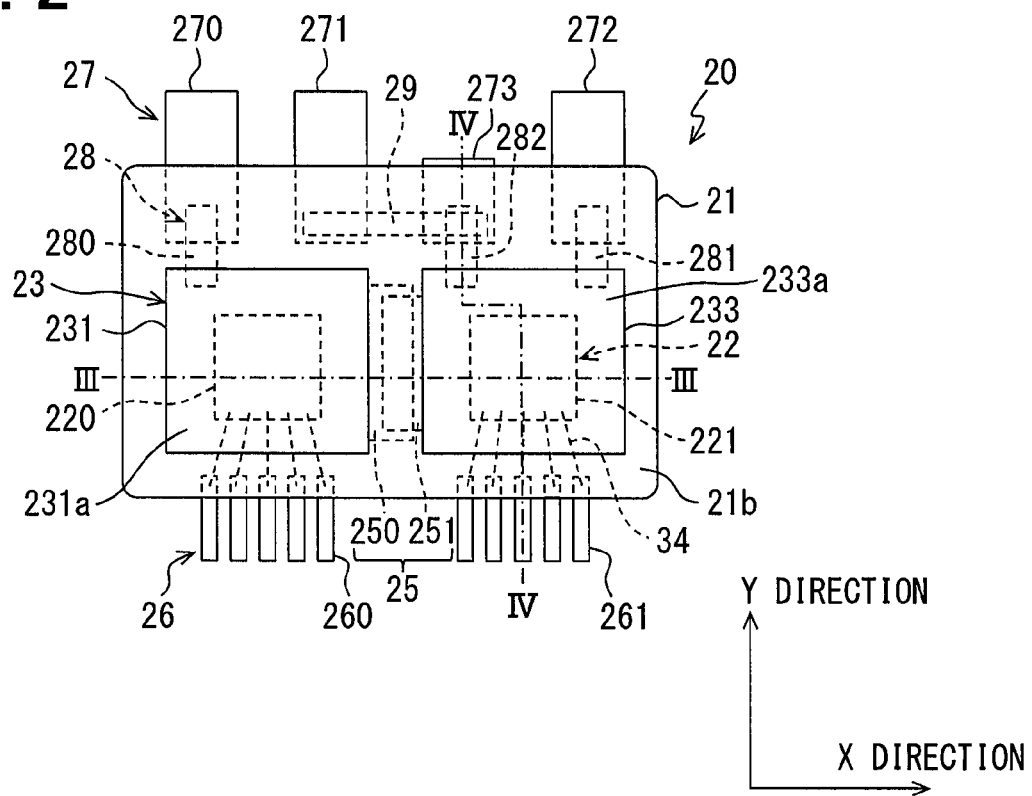
FIG. 2 is a plan view showing a schematic configuration of the semiconductor device.
Figure 3:
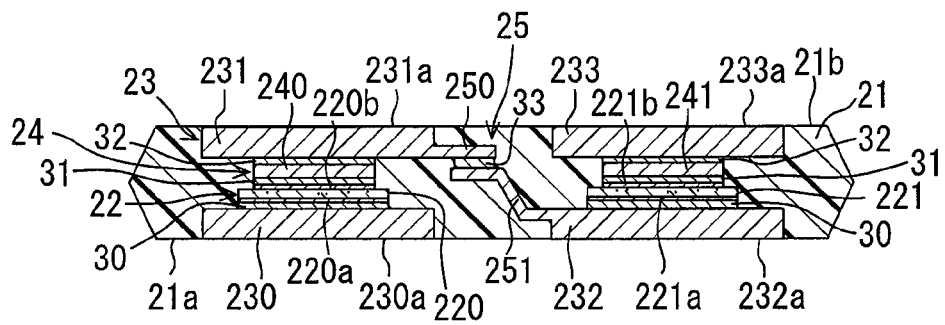
FIG. 3 is a cross-sectional view taken along a line III-III of FIG. 2.
Figure 4:
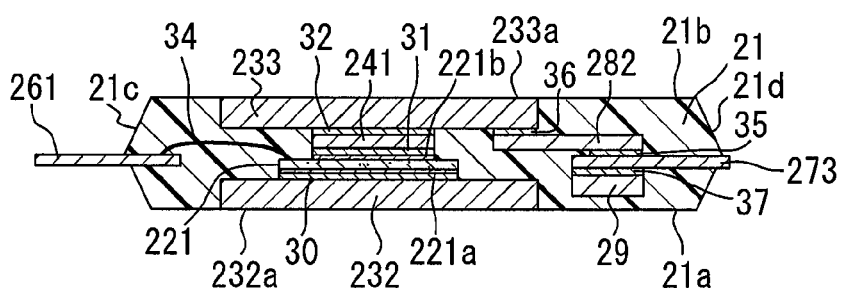
FIG. 4 is a cross-sectional view taken along a line IV-IV of FIG. 2.

As shown in FIGS. 2 to 4, the semiconductor device 20 includes a resin molded body 21, multiple semiconductor chips 22, multiple heat sinks 23, multiple terminals 24, at least one joint portion 25, multiple signal terminals 26, multiple main terminals 27, multiple first relay members 28, and at least one second relay member 29. The inverter 5 described above is configured by three semiconductor devices 20.

The resin molded body 21 is made of, for example, an epoxy resin. The resin molded body 21 is formed by, for example, a transfer molding method. The resin molded body 21 has one surface 21a orthogonal to the Z-direction, a back surface 21b opposite to the one surface 21a, and a side surface connecting the one surface 21a and the back surface 21b. The one surface 21a and the back surface 21b are flat surfaces, for example.

In the semiconductor chip 22, an IGBT configuring the upper and lower arm 8 is formed on a semiconductor substrate made of silicon or silicon carbide. The semiconductor chip 22 is sealed with the resin molded body 21. In the present embodiment, the semiconductor device 20 includes, as multiple semiconductor chips 22, a semiconductor chip 220 of the upper arm 9 and a semiconductor chip 221 of the lower arm 10. The semiconductor chip 220 of the upper arm 9 is formed with the IGBT 90 and the diode 91, and the semiconductor chip 221 of the lower arm 10 is formed with the IGBT 100 and the diode 101. The semiconductor chip 220 corresponds to a first semiconductor chip, and the semiconductor chip 221 corresponds to a second semiconductor chip. As described above, an RC (reverse conducting)-IGBT is formed in each of the semiconductor chips 220 and 221.

The semiconductor chips 220 and 221 are substantially rectangular in a plan view. The semiconductor chips 220 and 221 have substantially the same planar shape, specifically, a substantially rectangular planar shape, and have substantially the same size and substantially the same thickness as each other. The semiconductor chips 220 and 221 have the same configuration.

The semiconductor chip 220 of the upper arm 9 has a collector electrode 220a of the IGBT 90 on one surface 21a and an emitter electrode 220b of the IGBT 90 on the back surface 21b in the plate thickness direction of the semiconductor chip 220, that is, in the Z-direction. The collector electrode 220a also serves as a cathode electrode of the diode 91, and the emitter electrode 220b also serves as an anode electrode of the diode 91. The collector electrode 220a and the emitter electrode 220b correspond to a first main electrodes.

The semiconductor chip 221 of the lower arm 10 has a collector electrode 221a of the IGBT 100 on one side of the semiconductor chip 221 in the plate thickness direction and an emitter electrode 221b of the IGBT 100 on the other side. The collector electrode 221a also serves as a cathode electrode of the diode 101, and the emitter electrode 221b also serves as an anode electrode of the diode 101. The collector electrode 221a and the emitter electrode 221b correspond to second main electrodes. The semiconductor chips 220 and 221 are disposed so that the collector electrodes 220a and 221a are on the same side and the emitter electrodes 220b and 221b are on the same side in the Z-direction. The semiconductor chips 220 and 221 are positioned at substantially the same height in the Z-direction and are disposed horizontally along the X-direction.

Pads (not shown) serving as signal electrodes are formed on the surfaces of the semiconductor chips 220 and 221 on which the emitter electrodes 220b and 221b are formed. The pads are formed at positions different from the emitter electrodes 220b and 221b. The pads are electrically isolated from the emitter electrodes 220b and 221b. The pads are formed at end portions opposite to regions where the emitter electrodes 220b and 221b are formed in the Y-direction. In the present embodiment, the semiconductor chips 220 and 221 each have five pads. The five pads are collectively formed on one end side in the Y-direction in each of the semiconductor chips 220 and 221 having a substantially rectangular planar shape, and are aligned side by side in the X-direction. In the two semiconductor chips 220 and 221, the pads are formed on the same side in the Y-direction.

The heat sink 23 functions to dissipate heat of the corresponding semiconductor chip 22 to the outside of the semiconductor device 20, and also functions as a wiring. For that reason, in order to secure thermal conductivity and electrical conductivity, at least a metal material is used. A pair of the heat sinks 23 are provided so as to interpose the corresponding semiconductor chips 22 in the Z-direction. In the present embodiment, the semiconductor device 20 includes, as the multiple heat sinks 23, heat sinks 230 and 231 of the upper arm 9 that are disposed so as to interpose the semiconductor chip 220 therebetween, and heat sinks 232 and 233 of the lower arm 10 that are disposed so as to interpose the semiconductor chip 221 therebetween. The heat sinks 230 and 231 correspond to a pair of first heat sinks, and the heat sinks 232 and 233 correspond to a pair of second heat sinks. Each heat sink 23 is provided so as to encompass a corresponding semiconductor chip 22 in a projection view projected in the Z-direction.

The heat sinks 230 and 232 are disposed adjacent to the one surface 21a of the resin molded body 21 with respect to the corresponding semiconductor chip 22 in the Z-direction. The heat sinks 230 and 232 are electrically connected to the corresponding semiconductor chips 22 through a solder 30. More specifically, the heat sink 230 is connected to the collector electrode 220a of the semiconductor chip 220 through the solder 30. The heat sink 232 is connected to the collector electrode 221a of the semiconductor chip 221 through the solder 30. The heat sinks 230 and 232 are aligned side by side in the X-direction, and are disposed at substantially the same positions in the Z-direction.

Most of the heat sinks 230 and 232 are covered with the resin molded body 21. Of the surfaces of the heat sinks 230 and 232, heat radiation surfaces 230a and 232a opposite to the corresponding semiconductor chips 22 are exposed from the resin molded body 21. The heat radiation surfaces 230a and 232a are substantially flush with the one surface 21a. Of the surfaces of the heat sinks 230 and 232, portions excluding the connection portions with the solders 30 and the heat radiation surfaces 230a and 232a are covered with the resin molded body 21. The heat radiation surfaces 230a and 232a are exposed from the one surface 21a and aligned with each other in the X-direction.

The heat sinks 231 and 233 are disposed adjacent to a back surface 21b of the resin molded body 21 with respect to the corresponding semiconductor chip 22 in the Z-direction. Terminals 24 are interposed between the heat sinks 231 and 233 and the corresponding semiconductor chips 22. The terminals 24 are provided for the respective semiconductor chips 22. The terminals 24 are sealed with the resin molded body 21. In the present embodiment, the semiconductor device 20 includes, as the multiple terminals 24, a terminal 240 of the upper arm 9 interposed between the semiconductor chip 220 and the heat sink 231, and a terminal 241 of the lower arm 10 interposed between the semiconductor chip 221 and the heat sink 233.

Since the terminals 240 and 241 are positioned in the middle of a heat conduction and electric conduction path between the semiconductor chips 220 and 221 and the heat sinks 231 and 233, the terminals 240 and 241 are made of at least a metal material in order to secure heat conductivity and electrical conductivity. The terminal 240 is disposed to face the emitter electrode 220b and is connected to the emitter electrode 220b through the solder 31. The terminal 241 is disposed to face the emitter electrode 221b and is connected to the emitter electrode 221b through the solder 31.

The heat sinks 231 and 233 are connected to the surface of the corresponding terminals 24 opposite to the semiconductor chip 22 through the solder 32. In other words, the heat sink 231 is connected to the emitter electrode 220b of the semiconductor chip 220 through the solders 31 and 32 and the terminal 240. Similarly, the heat sink 233 is connected to the emitter electrode 221b of the semiconductor chip 221 through the solders 31 and 32 and the terminal 241. The heat sinks 231 and 233 are aligned side by side in the X-direction, and are disposed at substantially the same positions in the Z-direction.

Most of the heat sinks 231 and 233 are covered with the resin molded body 21. Of the surfaces of the heat sinks 231 and 233, heat radiation surfaces 231a and 233a opposite to the corresponding semiconductor chips 22 are exposed from the resin molded body 21. The heat radiation surfaces 231a and 233a are substantially flush with the back surface 21b. Of the surfaces of the heat sinks 231 and 233, portions excluding the connection portion with the solder 32 and the heat radiation surfaces 231a and 233a are covered with the resin molded body 21. The heat radiation surfaces 231a and 233a are exposed from the back surface 21b and aligned in the X-direction.

The joint portion 25 electrically connects the heat sink 231 disposed on the emitter electrode 220b side of the semiconductor chip 220 and the heat sink 232 disposed on the collector electrode 221a side of the semiconductor chip 221. One end of the joint portion 25 is connected to the vicinity of an end portion of the heat sink 231 in the X-direction, the end portion of the heat sink 231 being adjacent to the heat sink 233. The other end of the joint portion 25 is connected to the vicinity of an end portion of the heat sink 232 in the X-direction, the end portion of the heat sink 232 being adjacent to the heat sink 230. The joint portion 25 extends in the X-direction in a plan view when viewed in the Z-direction. The joint portion 25 is sealed with the resin molded body 21.

In the present embodiment, the semiconductor device 20 includes, as the joint portion 25, a joint portion 250 of the upper arm 9 connecting to the heat sink 231, and a joint portion 251 of the lower arm 10 connecting to the heat sink 232. The joint portions 250 and 251 are integrally provided with the corresponding heat sinks 23 by processing the same metal plates. The joint portions 250 and 251 are thinner than the corresponding heat sinks 23 so as to be covered with the resin molded body 21. The joint portions 250 and 251 connect to the corresponding heat sinks 23 so as to be substantially flush with the surface of the corresponding heat sinks 23 adjacent to the semiconductor chips 22.

The joint portion 250 has a thin plate shape and extends in the X-direction from a surface of the heat sink 231 facing the heat sink 233. The joint portion 251 extends from a surface of the heat sink 232 facing the heat sink 230 toward the heat sink 231. The joint portion 251 extends in the X-direction in a plan view when viewed in the Z-direction. In the present embodiment, as shown in FIG. 3, the joint portion 251 has two bent portions. A tip portion of the joint portion 251 overlaps with the joint portion 250 in a projection view projected in the Z-direction. The joint portions 250 and 251 are connected to each other through the solder 33.

The signal terminals 26 are electrically connected to pads of the corresponding semiconductor chips 22 through bonding wires 34. The signal terminals 26 extend in the Y-direction and projects to the outside from the side surface 21c of the resin molded body 21. In the present embodiment, the semiconductor device 20 includes signal terminals 260 of the upper arm 9 and signal terminals 261 of the lower arm 10, as the multiple signal terminals 26. The signal terminals 260 are connected to pads of the semiconductor chip 220, and the signal terminals 261 are connected to pads of the semiconductor chip 221.

The main terminal 27 is electrically connected to the semiconductor chip 22 through the corresponding heat sink 23. The main terminal 27 is made of a metal material and is also referred to as a lead terminal. The semiconductor device 20 includes multiple main terminals 27, and all the main terminals 27 project to the outside from the same side surface 21d of the resin molded body 21.

In the present embodiment, the main terminals 27 are formed of the same metal plate (lead frame) together with the heat sinks 230 and 232, the joint portion 251, and the signal terminal 26. The semiconductor device 20 includes a positive electrode terminal 270, a negative electrode terminal 271, an output terminal 272, and an auxiliary terminal 273 as the multiple main terminals 27. Each of the main terminals 27 is disposed so that the plate thickness direction is the same as the Z-direction which is the plate thickness direction of the semiconductor chip 22. The main terminals 27 are located on a side opposite to the signal terminals 26 so that the semiconductor chips 22 are located between the signal terminals 26 and the main terminals 27. Each of the main terminals 27 extends in the Y-direction and projects to the outside from the side surface 21d opposite to the side surface 21c. Projecting portions of the four main terminals 27 from the resin molded body 21 are disposed at substantially the same positions as each other in the Z-direction. The four main terminals 27 are aligned side by side in the X-direction. In the present embodiment, the four main terminals are disposed side by side at a predetermined pitch. End portions of the four main terminals 27 disposed in the resin molded body 21 are located at substantially the same positions in the Y-direction. The four main terminals 27 have substantially the same plate thickness and substantially the same width as each other.

The positive electrode terminal 270 is an external connection terminal for connecting the semiconductor device 20 to the high potential power supply line 6. The positive electrode terminal 270 is also referred to as a high potential power supply terminal and a P terminal. The positive electrode terminal 270 is electrically connected to the heat sink 230, which is the one on the high potential side of the heat sinks 230 and 231 connected to the semiconductor chip 220 of the upper arm 9.

The negative electrode terminal 271 is an external connection terminal for connecting the semiconductor device 20 to the low potential power supply line 7. The negative electrode terminal 271 is also referred to as a low potential power supply terminal and an N terminal. The negative electrode terminal 271 is electrically connected to the heat sink 233, which is the one on the low potential side of the heat sinks 232 and 233 connected to the semiconductor chip 221 of the lower arm 10.

The output terminal 272 is an external connection terminal electrically connected to a connection point of the upper and lower arm 8 formed in the semiconductor device 20. The output terminal 272 is electrically connected to one of the heat sink 231 on the low potential side connected to the semiconductor chip 220 and the heat sink 232 on the high potential side connected to the semiconductor chip 221. The output terminal 272 is also referred to as an O terminal. The output terminal 272 is electrically connected to the output line 11 to the motor 3.

The auxiliary terminal 273 functions to assist an electrical connection between the main terminal 27 other than the auxiliary terminal 273 and the corresponding heat sink 23 in accordance with the arrangement of the main terminals 27 other than the auxiliary terminal 273, that is, the arrangement of the positive electrode terminal 270, the negative electrode terminal 271, and the output terminal 272.

In the present embodiment, as shown in FIG. 2, the four main terminals 27 are arranged in order of the positive electrode terminal 270, the negative electrode terminal 271, the auxiliary terminal 273, and the output terminal 272, in a direction from the semiconductor chip 220 toward the semiconductor chip 221. In other words, the negative electrode terminal 271 is disposed adjacent to the positive electrode terminal 270. In order to realize the above arrangement, the negative electrode terminal 271 is electrically connected to the corresponding heat sink 233 through the auxiliary terminal 273.

The first relay member 28 electrically relays the main terminal 27 and the corresponding heat sink 23. The first relay member 28 is sealed in the resin molded body 21. In the present embodiment, the semiconductor device 20 includes first relay members 280 to 282 as the multiple first relay members 28. The first relay members 280 to 282 are extended in the Y-direction, and have the plate thickness direction in the Z-direction. One end of each first relay member 28 is connected to the surface of the corresponding heat sink 23 on the semiconductor chip 22 side, and the other end is connected to the surface of the corresponding main terminal 27 on the back surface 21b side.

The first relay member 280 electrically relays the positive electrode terminal 270 and the heat sink 230. One end of the first relay member 280 is connected to the positive electrode terminal 270 through a solder (not shown), and the other end is connected to the heat sink 230 through a solder (not shown). The first relay member 281 electrically relays the output terminal 272 and the heat sink 232. One end of the first relay member 281 is connected to the output terminal 272 through a solder (not shown), and the other end is connected to the heat sink 232 through a solder (not shown). The first relay member 282 electrically relays the auxiliary terminal 273 and the heat sink 233. As shown in FIG. 4, one end of the first relay member 282 is connected to the auxiliary terminal 273 through the solder 35, and the other end is connected to the heat sink 233 through the solder 36.

The second relay member 29 electrically relays the auxiliary terminal 273 and another main terminal 27 other than the auxiliary terminal 273, in accordance with the arrangement of the main terminals 27 other than the auxiliary terminal 273, that is, the arrangement of the positive electrode terminal 270, the negative electrode terminal 271, and the output terminal 272. The second relay member 29 is also sealed in the resin molded body 21. The second relay member 29 is extended in the X-direction, and has the plate thickness direction in the Z-direction.

In the present embodiment, in order to realize the above-described arrangement of the positive electrode terminal 270, the negative electrode terminal 271, the auxiliary terminal 273, and the output terminal 272, the second relay member 29 electrically relays the auxiliary terminal 273 and the negative electrode terminal 271. One end of the second relay member 29 is connected to the auxiliary terminal 273 through a solder 37, and the other end is connected to the negative electrode terminal 271 through a solder (not shown). The second relay member 29 electrically connects the main terminals 27 (271, 273) that are adjacent to each other in the X-direction. The negative electrode terminal 271 is connected to the corresponding heat sink 233 through the second relay member 29, the auxiliary terminal 273, and the first relay member 282. For that reason, it can be understood that the first relay member 282 electrically relays the negative electrode terminal 271 and the heat sink 233.

The second relay member 29 is connected to the negative electrode terminal 271 and the auxiliary terminal 273 on the side adjacent to the one surface 21a. As shown in FIG. 4, the second relay member 29 is connected to the auxiliary terminal 273 on the side adjacent to the one surface 21a, and the first relay member 282 is connected to the auxiliary terminal 273 on the side adjacent to the back surface 21b. In a plan view viewed in the Z-direction, the first relay member 282 and the second relay member 29 are disposed so as to partially overlap with each other.

In the semiconductor device 20 configured as described above, the semiconductor chip 22 (220, 221), a part of each of the multiple heat sinks 23, the terminal 24 (240, 241), the joint portion 25 (250, 251), a part of each of the multiple signal terminals 26, a part of each of the multiple main terminals 27, the first relay member 28 (280 to 282), and the second relay member 29 are integrally sealed by the resin molded body 21. In the semiconductor device 20, two semiconductor chips 220 and 221 configuring the upper and lower arm 8 for one phase are sealed by the resin molded body 21. For that reason, the semiconductor device 20 is also referred to as a 2 in 1 package.

As described above, the heat radiation surfaces 230a and 232a of the heat sinks 230 and 322 are located in the same plane and are substantially flush with the one surface 21a of the resin molded body 21. Similarly, the heat radiation surfaces 231a and 233a of the heat sinks 231 and 233 are located in the same plane, and are substantially flush with the back surface 21b of the resin molded body 21. In this manner, the semiconductor device 20 has a double-sided heat dissipation structure in which the heat radiation surfaces 230a, 231a, 232a, and 233a are exposed from the resin molded body 21.

The auxiliary terminal 273 is cut in the vicinity of a base portion of the projecting portion when unnecessary portions of the lead frame such as tie bars are removed after the resin molded body 21 is formed. As a result, the lengths of all the main terminals 27 are substantially equal to each other until a time of molding, and after molding, the projecting portion of the auxiliary terminal 273 is shorter than the other main terminals 27.

Next, an example of a method of manufacturing the semiconductor device 20 will be described.

First, the semiconductor chips 22 (220, 221), the lead frame including the heat sinks 230, 232, the signal terminals 26, and the main terminals 27, the heat sinks 231, 233, the terminals 24 (240, 241), the first relay members 28 (280 to 282), and the second relay member 29 are prepared. In the present embodiment, the heat sink 231 integrally provided with the joint portion 250 and the heat sink 232 integrally provided with the joint portion 251 are prepared.

Next, a first reflow is then performed. As a result, the semiconductor chip 220 is connected to the heat sink 230, and the terminal 240 is connected to the semiconductor chip 220. The semiconductor chip 221 is connected to the heat sink 232, and the terminal 241 is connected to the semiconductor chip 221. The heat sink 230 and the positive electrode terminal 270 are connected to each other through the first relay member 280, and the heat sink 232 and the output terminal 272 are connected to each other through the first relay member 281. The first relay member 282 is connected to the auxiliary terminal 273.

Next, the pads of the semiconductor chips 22 (220, 221) and the corresponding signal terminals 26 (260, 261) are connected to each other by bonding wires 34.

Next, a second reflow of the solder is performed. As a result, the heat sinks 23 (231, 233) are connected with the corresponding terminals 24 (240, 241). The joint portions 250 and 251 are connected to each other. The first relay member 282 is connected to the heat sink 233. The negative electrode terminal 271 and the auxiliary terminal 273 are connected to each other through the second relay member 29.

Next, a connection body formed through the above processes is placed in a molding die (die). Then, a resin in a molten state is injected into a cavity of the molding die to form the resin molded body 21. In the present embodiment, the resin molded body 21 is formed by a transfer molding method using an epoxy resin. At this time, the resin molded body 21 is formed so as to cover the heat radiation surfaces 230a, 231a, 232a, and 233a of the heat sinks 23 (230 to 233).

Next, cutting is performed for the resin molded body 21 on the one surface 21a side and the back surface 21b side. In this case, the cutting is performed together with the heat sink 23. With the cutting, the heat radiation surfaces 230a, 231a, 232a, and 233a are exposed from the resin molded body 21. In addition, the heat radiation surfaces 230a and 232a are substantially flush with the one surface 21a, and the heat dissipation surfaces 231a and 233a are substantially flush with the back surface 21b.

The resin molded body 21 may be formed in a state in which the heat radiation surfaces 230a, 231a, 232a, and 233a are in contact with a wall surface of the molding die. In this case, at the time of forming the resin molded body 21, the heat radiation surfaces 230a, 231a, 232a, and 233a are exposed from the resin molded body 21. This also makes it possible to eliminate the cutting process.

After molding, unnecessary portions of the lead frame such as tie bars are removed. In the present embodiment, the auxiliary terminal 273 is also cut in the vicinity of the base portion of the projecting portion. By the above processes, the semiconductor device 20 can be obtained. The manufacturing method described above is merely an example. For example, an example in which the multiple elements are connected to each other at the same time by the first reflow and the second reflow, but the present disclosure is not limited to the above example.

Figure 5:
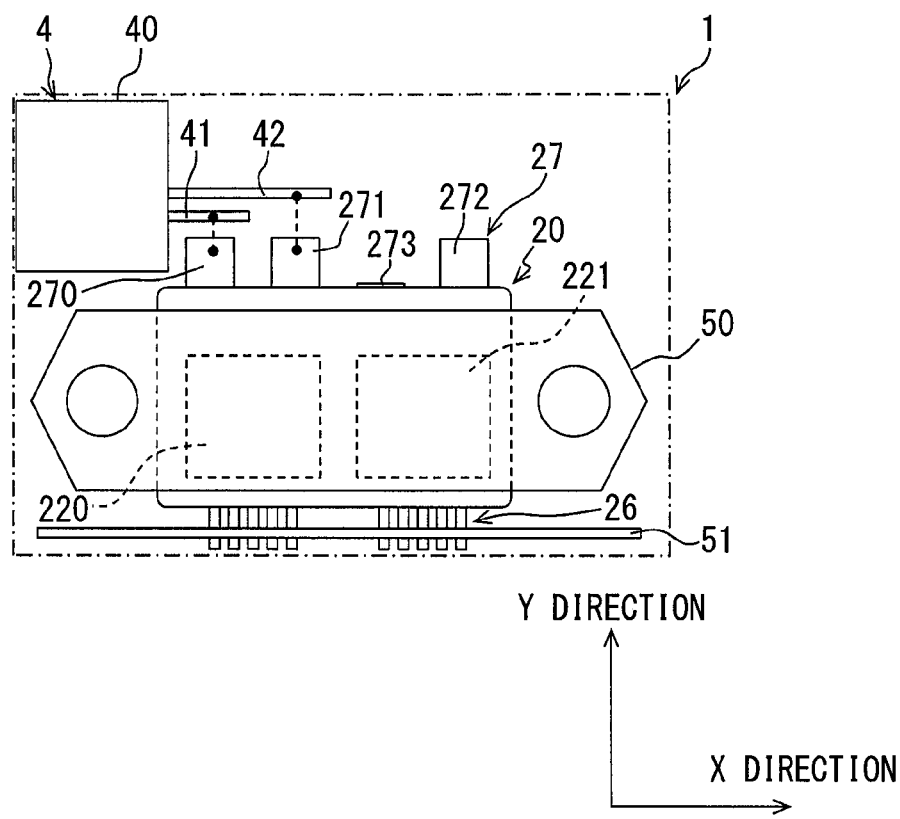
FIG. 5 is a diagram showing arrangements of elements of the power conversion device.
Figure 6:
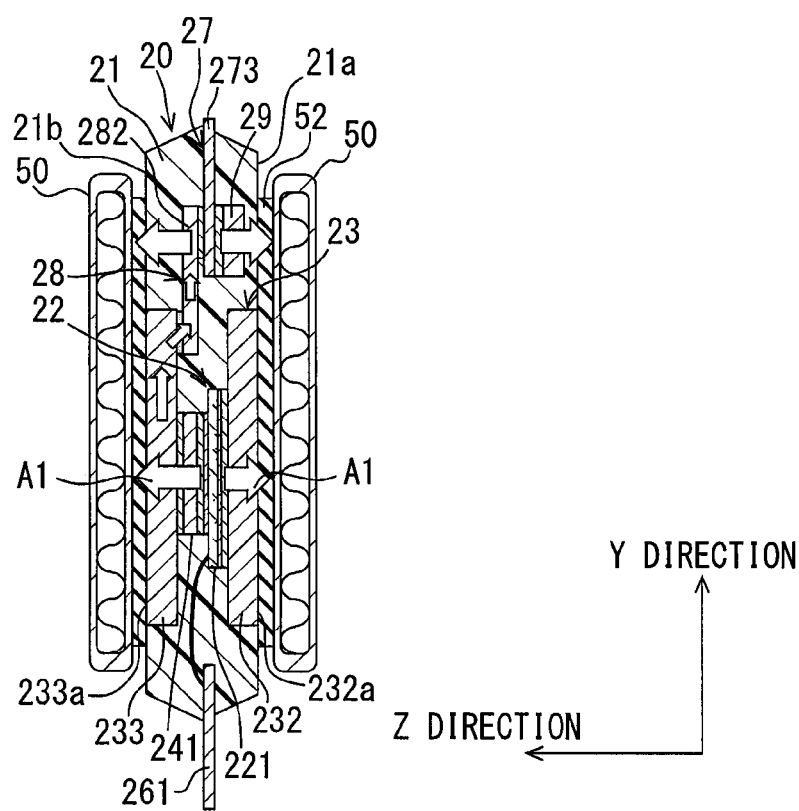
FIG. 6 is a diagram showing a heat dissipation structure from the semiconductor device to a cooler.

Next, the arrangement of the semiconductor devices 20, the smoothing capacitor 4, and the like configuring the power conversion device 1 will be described with reference to FIGS. 5 and 6. In FIG. 5, for convenience, the connection structure between the smoothing capacitor 4 and the semiconductor devices 20 is simplified and illustrated. FIG. 6 illustrates only one of the multiple semiconductor devices 20 configuring the power conversion device 1, and coolers located on both sides of the semiconductor device 20.

The power conversion device 1 includes the multiple semiconductor devices 20 described above. As shown in FIGS. 5 and 6, the power conversion device 1 includes the smoothing capacitor 4, coolers 50, a circuit board 51, and the like in addition to the semiconductor device 20.

The coolers 50 each have a refrigerant circulated inside and are disposed on both sides of each of the semiconductor devices 20 to cool the semiconductor devices 20 from both sides. The coolers 50 is each formed in a tubular shape (tube shape) so as to have a passage through which the refrigerant flows. In the Z-direction, the semiconductor devices 20 and the coolers 50 are alternately stacked on each other, and a predetermined distance is provided between the adjacent coolers 50.

For example, an insulating plate 52 having an electrical insulating property and a heat dissipation grease (not shown) are interposed between the semiconductor device 20 and the cooler 50. Therefore, the heat of the semiconductor chip 22 is mainly transferred from the heat sink 23 to the coolers 50 provided on both sides of the semiconductor device 20 through the grease and the insulating plates 52. A part of the heat of the semiconductor chip 22 is also transferred from the heat sink 23 to the main terminal 27 through the first relay member 28. In the Z-direction, the first relay member 28 is stacked on the main terminal 27, and the heat is readily dissipated to the cooler 50 as compared with the configuration of only the main terminal. The second relay member 29 is connected to the negative electrode terminal 271 and the auxiliary terminal 273. This also makes it easier to dissipate heat to the cooler 50 as compared with the configuration of only the main terminal. In particular, since the auxiliary terminal 273 has a stacked structure of three layers including the first relay member 282, the auxiliary terminal 273, and the second relay member 29, the heat can be efficiently dissipated to the coolers 50 on both sides of the semiconductor device 20. In FIG. 6, outline arrows A1 indicate heat transfer paths from the semiconductor chip 22.

As shown in FIG. 5, in a state in which the coolers 50 are stacked, signal terminals 26 of the semiconductor device 20 project from the cooler 50 to one side in the Y-direction, and the main terminals 27 project to the opposite side of the signal terminals 26.

A control circuit for controlling the driving of the inverter 5 and the like are formed on the circuit board 51. The signal terminals 26 of the semiconductor device 20 are electrically connected to the circuit board 51. In an example shown in FIG. 5, the signal terminals 26 are inserted into and mounted in the circuit board 51.

The smoothing capacitor 4 has a main body portion 40 in which a capacitor is formed, a positive electrode terminal 41 connected to the positive electrode of the battery 2, and a negative electrode terminal 42 connected to the negative electrode. The positive electrode terminal 270 is electrically connected to the positive electrode terminal 41 through a bus bar (not shown). The negative electrode terminal 271 is electrically connected to the negative electrode terminal 42 through a bus bar (not shown). The main body portion 40 of the smoothing capacitor 4 is provided on a side adjacent to the main terminal 27 in the Y-direction and on a side opposite to the negative electrode terminal 271 with respect to the positive electrode terminal 270, in consideration of the reduction of the inductance of the bus bar, a mounting space in the vehicle, a capacitance (that is, size) of the smoothing capacitor 4, and the like. A dashed-dotted line in FIG. 5 indicates an external shape (size) of the power conversion device 1.

Next, the effects of the semiconductor device 20 described above will be described.

In the semiconductor device 20 of the present embodiment, the main terminals 27 are provided as members separate from the heat sinks 23. The semiconductor device 20 has an auxiliary terminal 273 in addition to the positive electrode terminal 270, the negative electrode terminal 271, and the output terminal 272 as the multiple main terminals 27. The main terminals 27 are aligned side by side in the X-direction. The main terminals 27 have the same potential as that of the heat sinks 23 connected through the first relay members 28. In addition, the main terminal 27 located away from the heat sink 23 has the same potential as the heat sink 23 as being through the auxiliary terminal 273 and the second relay member 29. In this manner, using the auxiliary terminal 273, the first relay member 28, and the second relay member 29 allow to freely set the arrangement of the positive electrode terminal 270, the negative electrode terminal 271, and the output terminal 272 in the multiple main terminals 27 aligned side by side in the X-direction. In other words, the degree of freedom of arrangement of the main terminals 27 can be improved.

In addition, the arrangement order of the positive electrode terminal 270, the negative electrode terminal 271, and the output terminal 272 can be changed without changing the alignment of the multiple main terminals 27, but simply by changing the presence or absence of connection by the second relay member 29 and the connection target of the first relay member 28 and the second relay member 29. For example, if the capacitance of the smoothing capacitor 4 is changed, the arrangement order of the positive electrode terminal 270, the negative electrode terminal 271, and the output terminal 272 may need to be changed. Even in such a case, it is not necessary to change the alignment of the multiple main terminals 27 including the auxiliary terminal 273. Therefore, the same molding die as before the change can be used.

As described above, according to the semiconductor device 20 of the present embodiment, the degree of freedom in arrangement of the main terminals 27 can be improved. Further, the molding die can be used also when the arrangement of the main terminals 27 is changed. The above configuration will be described later.

In particular, according to the present embodiment, the output terminal 272 is connected to the corresponding heat sink 232 through the first relay member 281, and the negative electrode terminal 271 is connected to the corresponding heat sink 233 through the first relay member 282, the auxiliary terminal 273, and the second relay member 29. As a result, the negative electrode terminal 271 is disposed adjacent to the positive electrode terminal 270. Therefore, the inductance can be reduced.

The second relay member 29 is connected to the auxiliary terminal 273 on the side adjacent to the one surface 21a, and the first relay member 282 is connected to the auxiliary terminal 273 on the side adjacent to the back surface 21b. In the plan view viewed in the Z-direction, the first relay member 282 and the second relay member 29 are disposed so as to partially overlap with each other. Therefore, the size of the semiconductor device 20 can be reduced in the Y-direction.

Further, a projection length of the auxiliary terminal 273 is shorter than the projection length of the other main terminals 27 (270 to 272). As a result, when the bus bar is welded to the main terminal 27 (for example, the negative electrode terminal 271), the auxiliary terminal 273 does not interfere with the welding, and the productivity can be improved. In addition, this makes it possible to inhibit the auxiliary terminal 273 from short-circuiting with the other main terminal 27 outside the resin molded body 21.

Figure 7:
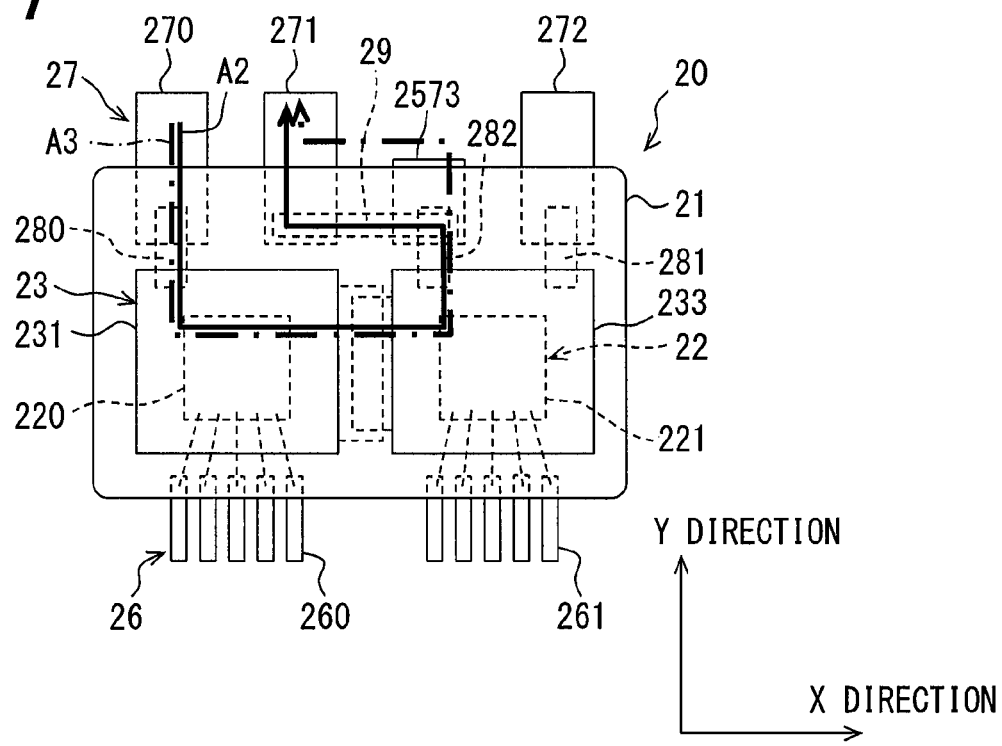
FIG. 7 is a diagram showing a current path in the semiconductor device.

The first relay member 28 and the second relay member 29 are disposed in the resin molded body 21. Specifically, in the resin molded body 21, the negative electrode terminal 271 is connected to the auxiliary terminal 273 through the second relay member 29, and the auxiliary terminal 273 is connected to the heat sink 233 through the first relay member 282. As a result, as shown in FIG. 7, a current loop of the upper and lower arm 8 from the positive electrode terminal 270 to the negative electrode terminal 271 can be reduced as compared with the configuration in which the relay member is connected outside the resin molded body. In other words, the inductance can be reduced. A solid line arrow A2 shown in FIG. 7 indicates a current loop of the present embodiment, and a dashed line arrow A3 indicates a current loop of a reference example in which a relay member is connected outside the resin molded body.

Figure 8:
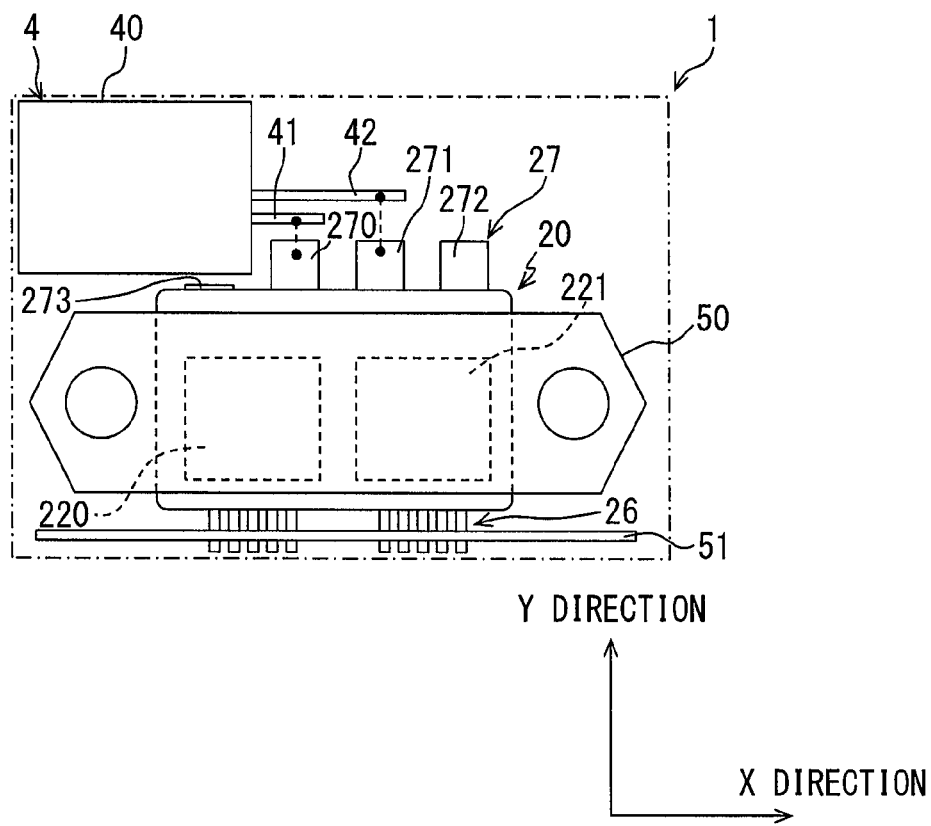
FIG. 8 is a diagram showing a first modification, which corresponds to FIG. 5.
Figure 9:
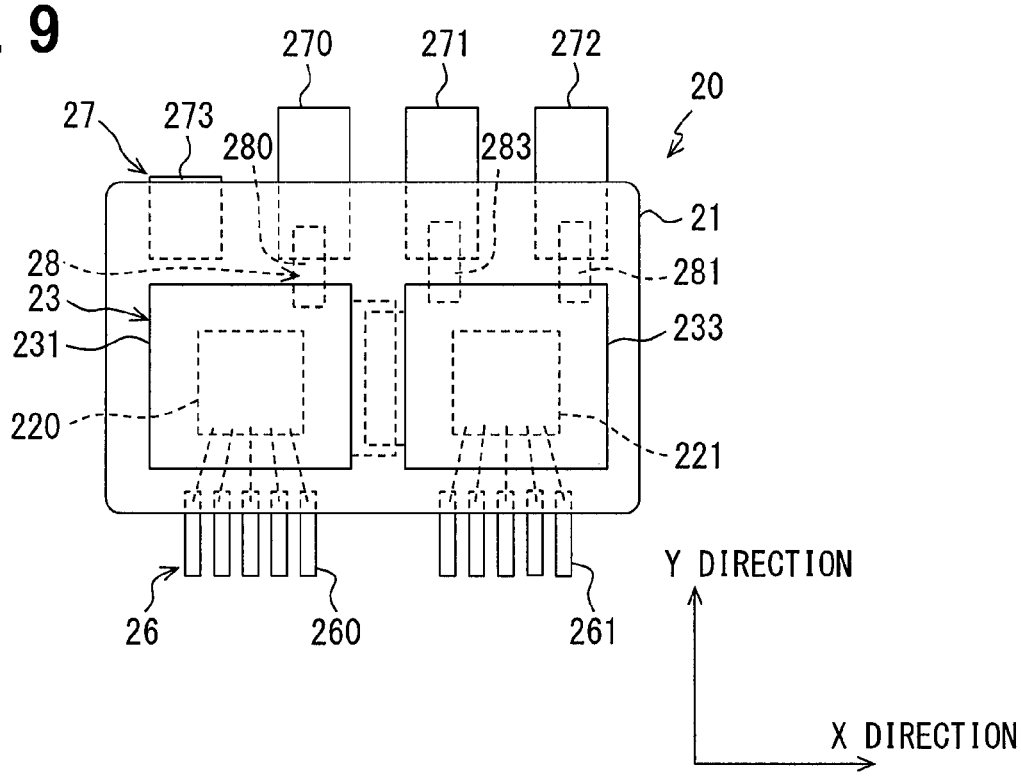
FIG. 9 is a plan view showing a schematic configuration of a semiconductor device shown in FIG. 8.
Figure 10:
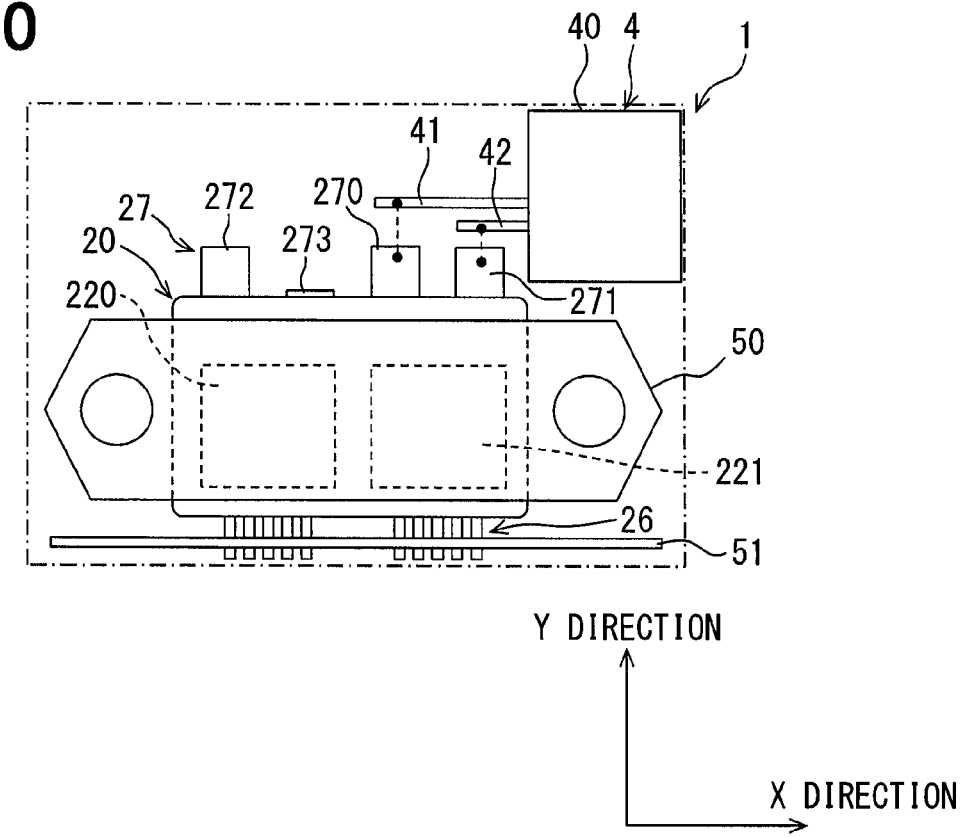
FIG. 10 is a diagram showing a second modification, which corresponds to FIG. 5.
Figure 11:
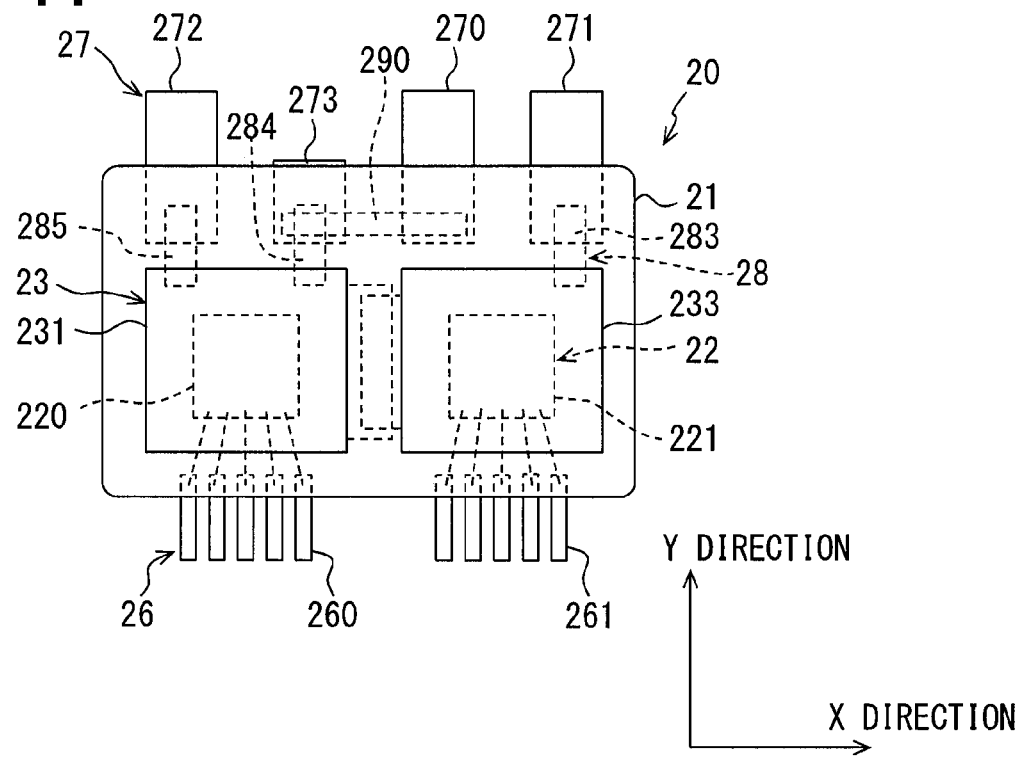
FIG. 11 is a plan view showing a schematic configuration of a semiconductor device shown in FIG. 10.
Figure 12:
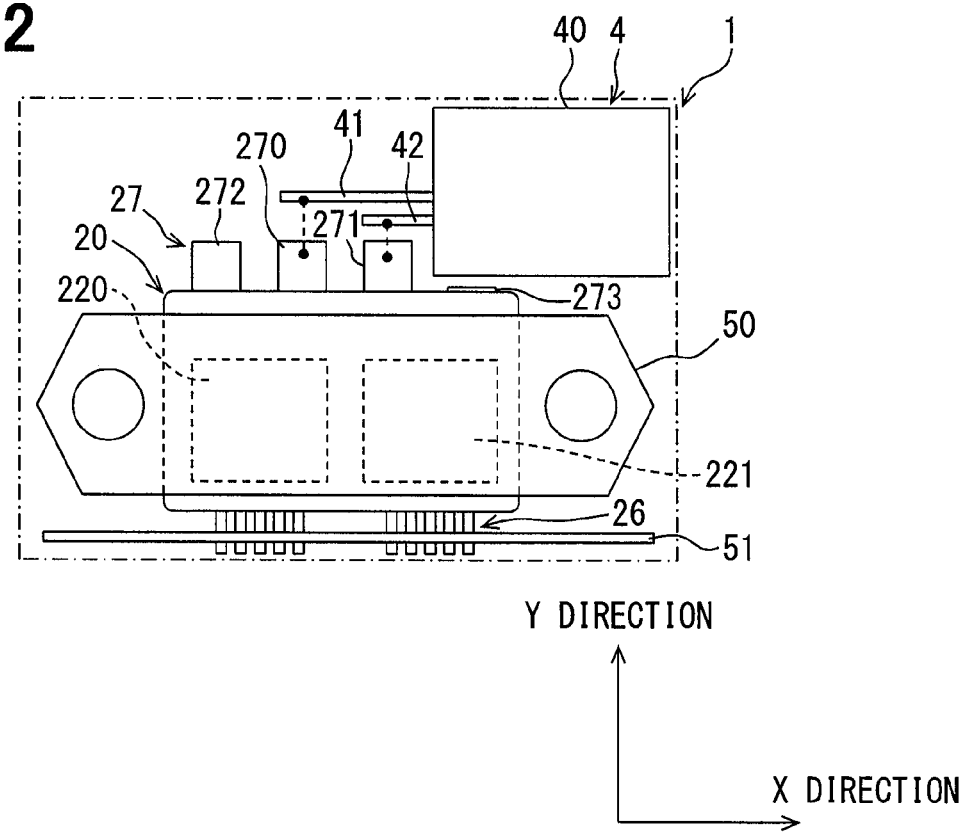
FIG. 12 is a diagram showing a third modification, which corresponds to FIG. 5.
Figure 13:
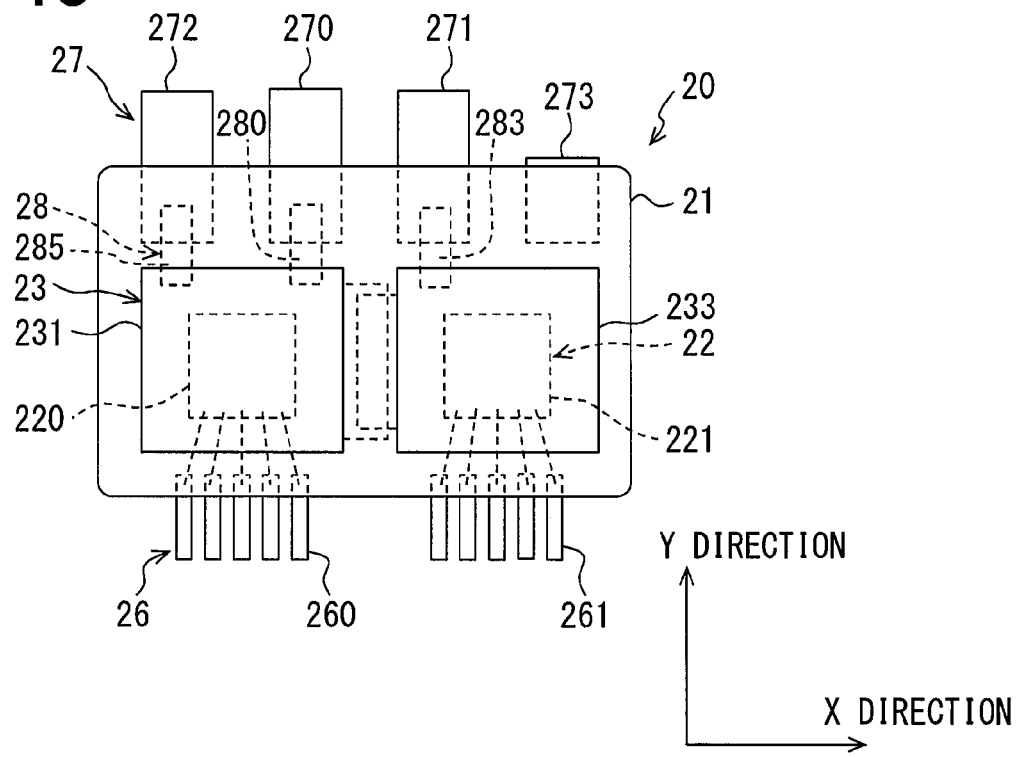
FIG. 13 is a plan view showing a schematic configuration of a semiconductor device shown in FIG. 12.

Next, a description will be given of multiple modifications in which the molding die can be diverted while improving the degree of freedom of arrangement of the main terminals 27. FIGS. 8 and 9 show a first modification. FIGS. 10 and 11 show a second modification. FIGS. 12 and 13 show a third modification. FIGS. 8, 10 and 12 correspond to FIG. 5, and FIGS. 9, 11 and 13 correspond to FIG. 2. A dashed-dotted line in FIGS. 8, 10, and 12 indicates a size of the power conversion device 1. The size of the power conversion device 1 in each modification is the same as the size of the power conversion device 1 shown in FIG. 5.

As shown in FIG. 5, according to the present embodiment, since the capacitance of the smoothing capacitor 4 is relatively small, among the four main terminals 27 aligned side by side in the X-direction, the main terminal 27 on an end adjacent to the smoothing capacitor 4 is provided as the positive electrode terminal 270, and the main body portion 40 is disposed on an outer side of the positive electrode terminal 270. In order to reduce the inductance, the main terminal 27 adjacent to the positive electrode terminal 270 is provided as the negative electrode terminal 271 as it can be connected through the first relay member 282, the auxiliary terminal 273, and the second relay member 29.

On the contrary, in the first modification, as shown in FIG. 8, the capacitance of the smoothing capacitor 4 is larger than that in FIG. 5. For that reason, the four main terminals 27 are disposed in the order of the auxiliary terminal 273, the positive electrode terminal 270, the negative electrode terminal 271, and the output terminal 272 in a direction from the semiconductor chip 220 toward the semiconductor chip 221. The main body portion 40 is extended to the upper area of the auxiliary terminal 273, so that the size of the power conversion device 1 is the same as that shown in FIG. 5.

In order to realize the arrangement of the main terminals 27 as described above, in the semiconductor device 20 shown in FIG. 9, the three main terminals 27 adjacent to the semiconductor chip 221, among the four main terminals 27 aligned in the X-direction, are connected to the corresponding heat sinks 23 through the first relay members 28, and the second relay member 29 is not used. More specifically, the main terminal 27 at the end adjacent to the semiconductor chip 221 is connected to the heat sink 232 through the first relay member 281 to form an output terminal 272. In addition, the main terminal 27 adjacent to the output terminal 272 is connected to the heat sink 233 through the first relay member 283 to form the negative electrode terminal 271. The main terminal 27 adjacent to the negative electrode terminal 271 is connected to the heat sink 230 through the first relay member 280 to form the positive electrode terminal 270. The main terminal 27 at the end adjacent to the semiconductor chip 220 is referred to as the auxiliary terminal 273. In FIG. 9, the first relay member 28 is not connected to the auxiliary terminal 273, but the auxiliary terminal 273 may be connected to any of the heat sinks 230 and 231 through the first relay member 28.

In the first modification, in a plan view in the Z-direction, a distance (shortest distance) between the positive electrode terminal 270 and the corresponding heat sink 230 is substantially equal to a distance (shortest distance) between the heat sink 230 and the auxiliary terminal 273. In addition, a distance (shortest distance) between the negative electrode terminal 271 and the corresponding heat sink 233 is shorter than a distance (shortest distance) between the heat sink 233 and the auxiliary terminal 273. For that reason, the positive electrode terminal 270 and the negative electrode terminal 271 are connected to the corresponding heat sinks 23 (230, 233) not through the auxiliary terminal 273.

In a second modification, the main body portion 40 of the smoothing capacitor 4 is disposed adjacent to the semiconductor chip 221 in the X-direction for the convenience of the mounting space of the vehicle. A capacitance of the smoothing capacitor 4 is about the same as that shown in FIG. 5. For that reason, as shown in FIG. 10, the four main terminals 27 are provided in the order of the output terminal 272, the auxiliary terminal 273, the positive electrode terminal 270, and the negative electrode terminal 271 in a direction from the semiconductor chip 220 toward the semiconductor chip 221. The size of the power conversion device 1 is the same as that shown in FIG. 5 in a state where the main body portion 40 is disposed outside the negative electrode terminal 271.

In order to realize the arrangement of the main terminals 27 as described above, in the semiconductor device 20 shown in FIG. 11, of the four main terminals 27 aligned in the X-direction, the main terminal 27 on an end adjacent to the semiconductor chip 221, is connected to the corresponding heat sink 233 through the first relay member 283 to form the negative electrode terminal 271. The main terminal 27 adjacent to the negative electrode terminal 271 is provided as the positive electrode terminal 270, and the main terminal 27 adjacent to the positive electrode terminal 270 is provided as the auxiliary terminal 273. The positive electrode terminal 270 is connected to the corresponding heat sink 230 through the first relay member 284, the auxiliary terminal 273, and the second relay member 290. The main terminal 27 at the end portion of the semiconductor chip 220 is connected to the heat sink 231 through the first relay member 285 to form the output terminal 272.

In the second modification, the positive electrode terminal 270 is located farther from the corresponding heat sink 230 than the auxiliary terminal 273 in a plan view viewed in the Z-direction. For that reason, the positive electrode terminal 270 is connected to the corresponding heat sink 230 through the first relay member 284, the auxiliary terminal 273, and the second relay member 290.

Also in a third modification, the main body portion 40 of the smoothing capacitor 4 is disposed adjacent to the semiconductor chip 221 in the X-direction for the convenience of the mounting space of the vehicle. As shown in FIG. 12, a capacitance of the smoothing capacitor 4 is large in the same manner as in FIG. 8. For that reason, the four main terminals 27 are provided in the order of the output terminal 272, the positive electrode terminal 270, the negative electrode terminal 271, and the auxiliary terminal 273 in a direction from the semiconductor chip 220 toward the semiconductor chip 221. The main body portion 40 is extended to the upper area of the auxiliary terminal 273, so that the size of the power conversion device 1 is the same as that shown in FIG. 5.

In order to realize the arrangement of the main terminals 27 as described above, the semiconductor device 20 shown in FIG. 13 has a configuration in which three of the main terminals 27 adjacent to the semiconductor chip 220, among the four main terminals 27 aligned in the X-direction, are connected to the corresponding heat sinks 23 through the first relay members 28, and the second relay member 29 is not used. More specifically, the main terminal 27 at the end adjacent to the semiconductor chip 220 is connected to the heat sink 231 through the first relay member 285 to form the output terminal 272. In addition, the main terminal 27 adjacent to the output terminal 272 is connected to the heat sink 230 through the first relay member 280 to form the positive electrode terminal 270. Further, the main terminal 27 adjacent to the positive electrode terminal 270 is connected to the heat sink 233 through the first relay member 283 to form the negative electrode terminal 271. The main terminal 27 at the end adjacent to the semiconductor chip 221 is referred to as the auxiliary terminal 273. In FIG. 13, the first relay member 28 is not connected to the auxiliary terminal 273, but the auxiliary terminal 273 may be connected to one of the heat sinks 232 and 233 through the first relay member 28.

In the third modification, in a plan view viewed in the Z-direction, a distance (shortest distance) between the positive electrode terminal 270 and the corresponding heat sink 230 is shorter than a distance (shortest distance) between the heat sink 230 and the auxiliary terminal 273. The distance (shortest distance) between the negative electrode terminal 271 and the corresponding heat sink 233 is substantially equal to the distance (shortest distance) between the heat sink 233 and the auxiliary terminal 273. For that reason, the positive electrode terminal 270 and the negative electrode terminal 271 are connected to the corresponding heat sinks 23 (230, 233) not through the auxiliary terminal 273.

In the configurations shown in FIGS. 2, 9, 11, and 13, the arrangement order of the positive electrode terminal 270, the negative electrode terminal 271, and the output terminal 272 can be changed only by changing the presence or absence of connection by the second relay member 29 and the connection target of the first relay member 28 and the second relay member 29, without changing the alignment of the multiple main terminals 27. Therefore, the degree of freedom of arrangement of the main terminals 27 can be improved. In addition, since the alignment (position) of the multiple main terminals 27 including the auxiliary terminal 273 is not changed, even when the arrangement of the positive electrode terminal 270, the negative electrode terminal 271, and the output terminal 272 is changed, the same molding die as before the change can be used.

In addition, the main terminal 27 is provided as a separate member from the heat sink 23, and the positive electrode terminal 270, the negative electrode terminal 271, the output terminal 272, and the auxiliary terminal 273 are aligned side by side in the X-direction. Therefore, in the configuration in which the negative electrode terminal 271 is disposed adjacent to the positive electrode terminal 270, when at least one of the positive electrode terminal 270 and the negative electrode terminal 271 is located farther than the auxiliary terminal 273 from the corresponding heat sink 23 in a plan view viewed in the Z-direction, the terminal located farther than the auxiliary terminal 273 (for example, the positive electrode terminal 270) is connected to the corresponding heat sink 23 through the first relay member 28 and the auxiliary terminal 273. On the other hand, when a distance between the positive electrode terminal 270, the negative electrode terminal 271 and the corresponding heat sinks 23 is equal to or less than a distance between the corresponding heat sink 23 and the auxiliary terminal 273, the positive electrode terminal 270 and the negative electrode terminal 271 are connected to the corresponding heat sinks 23 through the first relay member 28 not through the auxiliary terminal 273.

Second Embodiment

The present embodiment can refer to the preceding embodiment. For that reason, a description of portions common to the power conversion device 1 and the semiconductor device 20 described in the preceding embodiment will be omitted.

Figure 14:
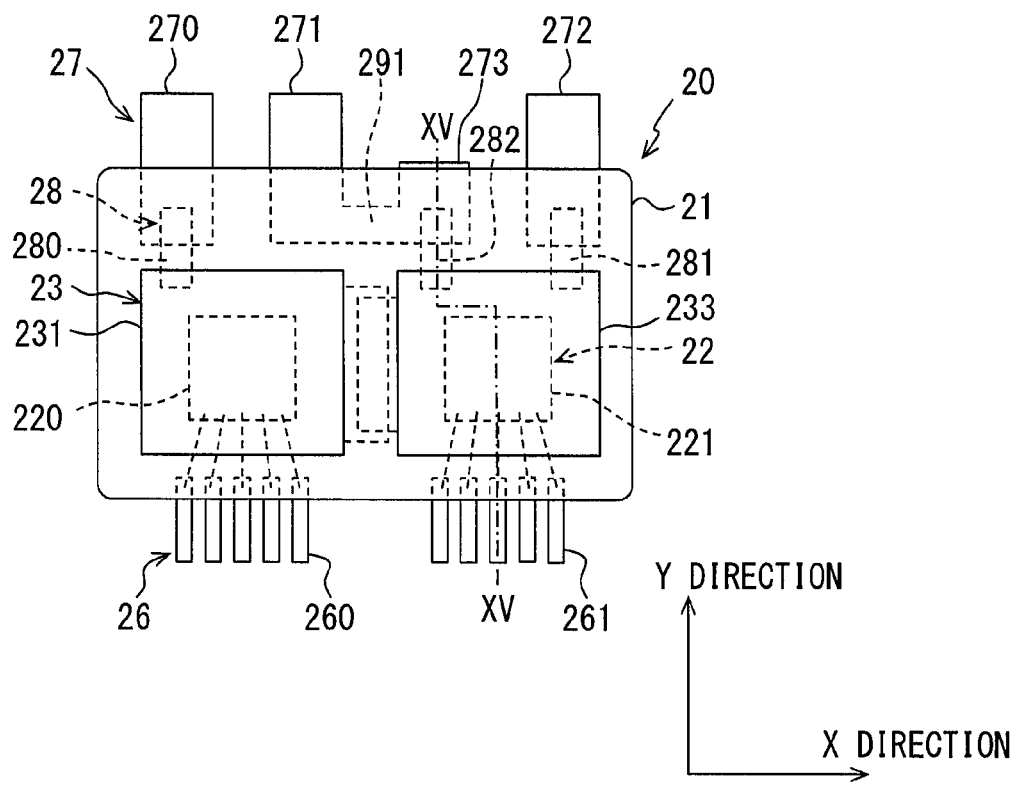
FIG. 14 is a plan view showing a schematic configuration of a semiconductor device according to a second embodiment.
Figure 15:
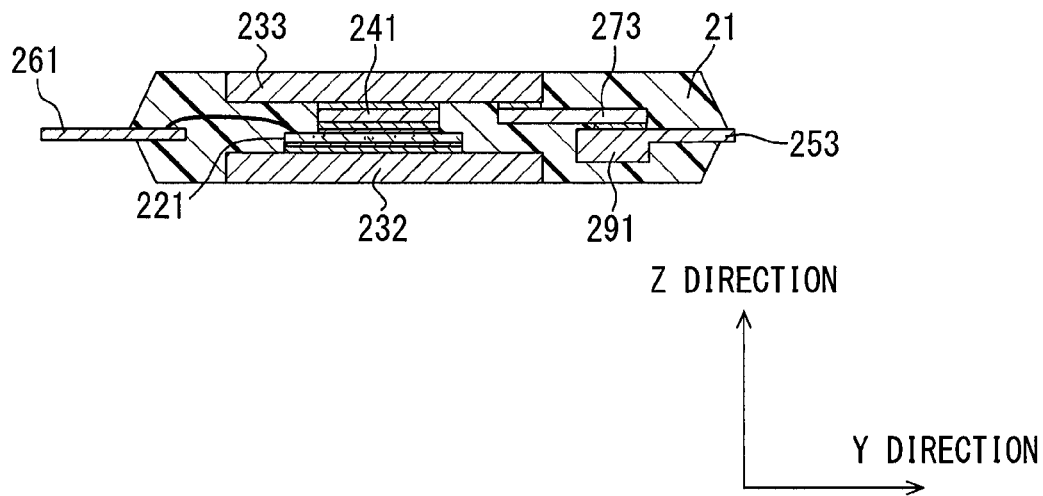
FIG. 15 is a cross-sectional view taken along a line XV-XV of FIG. 14.

As shown in FIGS. 14 and 15, in the present embodiment, a second relay member 291 is provided integrally with multiple main terminals 27 to be electrically relayed. The second relay member 291 is provided integrally with an auxiliary terminal 273 and another main terminal 27 other than the auxiliary terminal 273, as the second relay member 291 electrically relays the auxiliary terminal 273 and the main terminal 27 other than the auxiliary terminal 273. In FIG. 14, the second relay member 291 is provided integrally with the negative electrode terminal 271 and the auxiliary terminal 273. The negative electrode terminal 271, the auxiliary terminal 273, and the second relay member 291 are formed by punching out metal plates having different shapes.

According to the above configuration, the effects comparable to those of the first embodiment can be obtained. In addition, a step of connecting the second relay member 291 and the main terminals 27 can be omitted.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

Although the present disclosure is exemplarily employed to the configuration in which the IGBTs 90 and 100 and the diodes 91 and 101 are formed on the same semiconductor chips 22 (220 and 221), the present disclosure may be employed to a configuration in which the IGBTs 90 and 100 and the diodes 91 and 101 are formed on different chips.

The switching element is not limited to the IGBT. For example, an MOSFET may be employed.

Although the semiconductor device 20 exemplarily has the terminals 24 (240 and 241), the semiconductor device 20 may not be provided with the terminals 24.

The heat radiation surfaces 230*a*, 231*a*, 232*a*, and 233*a* are exemplarily exposed from the resin molded body 21. However, the present disclosure is also applicable to a configuration in which the heat radiation surfaces 230*a*, 231*a*, 232*a*, and 233*a* are not exposed.

Although the example in which the auxiliary terminal 273 is cut off at the base portion of the projecting portion has been described, the present disclosure is not limited to the above configuration. As in the fourth modification shown in FIG. 16, the auxiliary terminal 273 is not cut off, and the projection length of the auxiliary terminal 273 may be substantially equal to the projection length of the other main terminals 27 (270 to 272).

Figure 16:
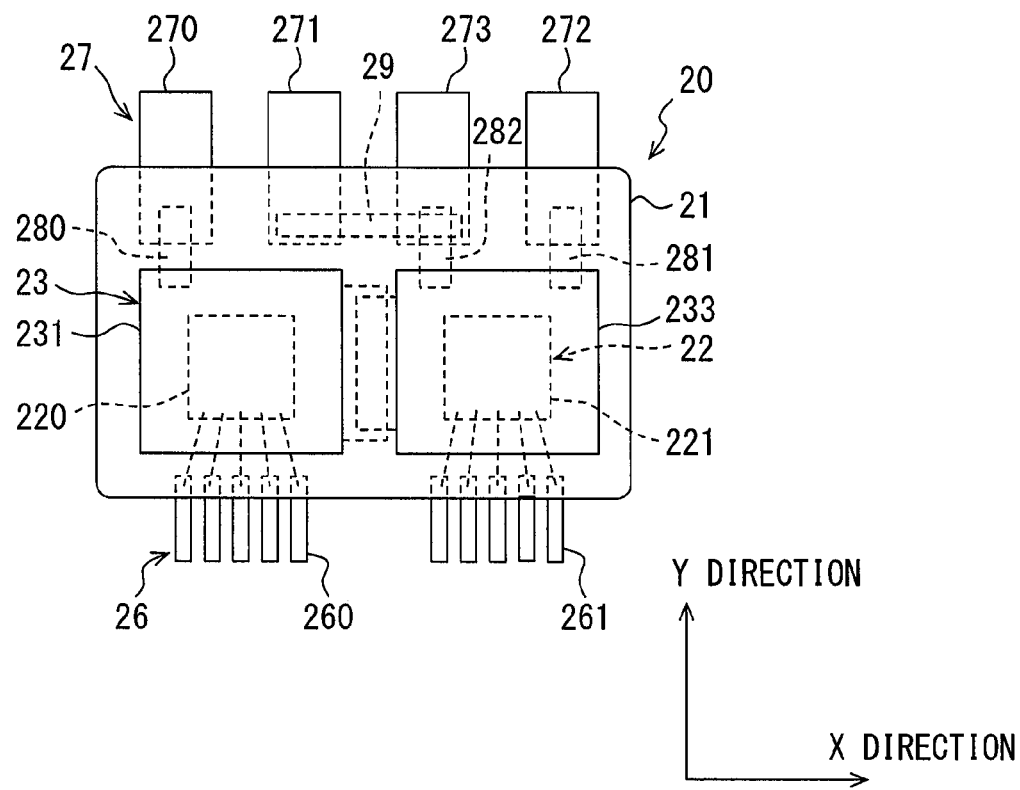
FIG. 16 is a plan view showing a fourth modification.

In an example shown in FIG. 16, since the auxiliary terminal 273 has the same potential as that of the negative electrode terminal 271, the auxiliary terminal 273 may be connected to the negative electrode terminal 42 of the smoothing capacitor 4 together with the negative electrode terminal 271. The present disclosure is not limited to the example in which the auxiliary terminal 273 is electrically connected to the negative electrode terminal 271, and the same applies to the case in which the auxiliary terminal 273 is electrically connected to the positive electrode terminal 270 and the output terminal 272.

The number of main terminals 27 is not limited to four. Since the positive electrode terminal 270, the negative electrode terminal 271, the output terminal 272, and at least one auxiliary terminal 273 may be included, four or more terminals may be used. In a fifth modification shown in FIG. 17, five main terminals 27 are aligned side by side in the X-direction. The positive electrode terminal 270, the negative electrode terminal 271, the auxiliary terminal 273, the auxiliary terminal 273, and the output terminal 272 are arranged in a stated order in a direction from the semiconductor chip 220 to the semiconductor chip 221. The first relay member 282 is connected to the auxiliary terminal 273 adjacent to the output terminal 272, and the negative electrode terminal 271 and the two auxiliary terminals 273 are connected to each other by the second relay member 292.

Figure 17:
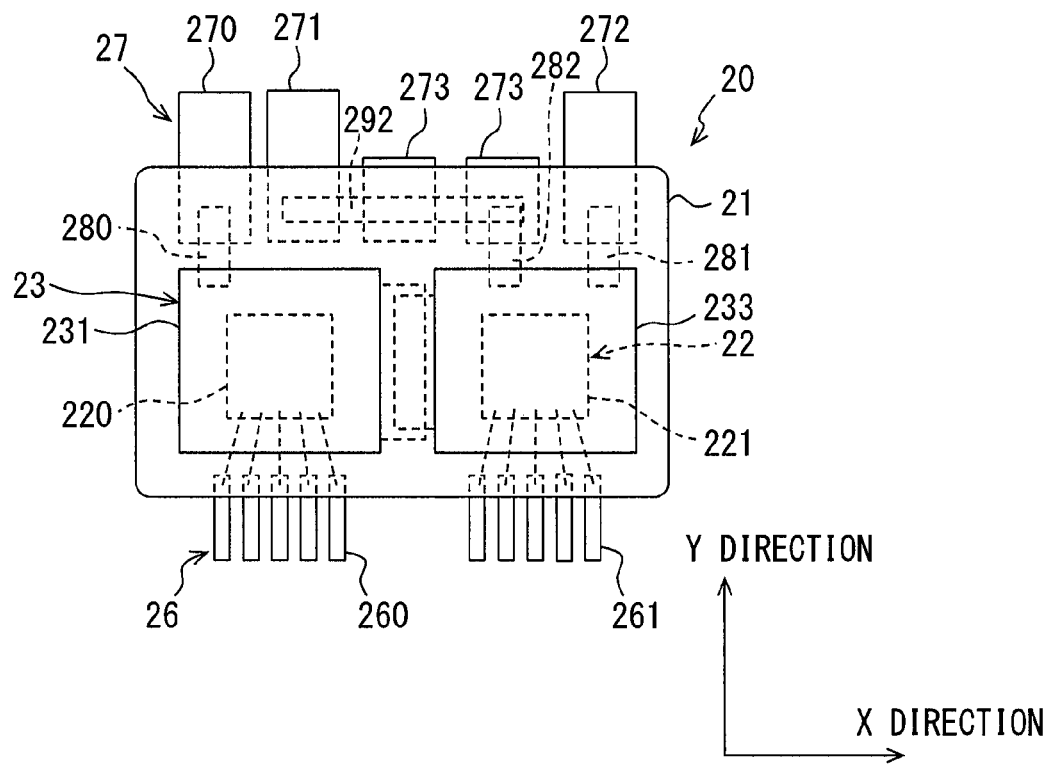
FIG. 17 is a plan view showing a fifth modification.

The arrangement of the five main terminals 27 is not limited to that shown in FIG. 17. Also, the number of the second relay terminals is not limited to one.

The connection target of the second relay member is not limited to the negative electrode terminal 271. The positive electrode terminal 270 and the output terminal 272 may be electrically relayed to the auxiliary terminal 273 through the second relay member. It is preferable that the second relay member is connected to at least one of the positive electrode terminal 270 and the negative electrode terminal 271. According to the above configuration, the degree of freedom of arrangement of the positive electrode terminal 270 and the negative electrode terminal 271 can be improved, and the inductance can be reduced.

Although the example in which the negative electrode terminal 271 is disposed adjacent to the positive electrode terminal 270 has been described, the present disclosure is not limited to the above configuration. However, a configuration in which the negative electrode terminal 271 is disposed adjacent to the positive electrode terminal 270 is preferable because the inductance can be obtained.

Although the example in which the second relay member is disposed on the auxiliary terminal 273 on the side of the one surface 21*a* and the first relay member is disposed on the auxiliary terminal 273 on the side of the back surface 21*b* has been described, the present disclosure is not limited to the above configuration. The first relay member and the second relay member may be disposed adjacent to the same surface of the auxiliary terminal 273. However, when the second relay member is disposed on the auxiliary terminal 273 adjacent to the one surface 21*a* and the first relay member is disposed on the auxiliary terminal 273 adjacent to the back surface 21*b*, and further the first relay member and the second relay member are disposed so as to partially overlap with each other in a plan view when viewed in the Z-direction, the size of the semiconductor device 20 can be reduced in the Y-direction, and which is preferable.

What is claimed is:

1. A semiconductor device, which configures an upper and lower arm and to be electrically connected to a smoothing capacitor, the upper and lower arm having an upper arm and a lower arm connected in series to each other, the semiconductor device comprising:
a plurality of semiconductor chips including a first semiconductor chip and a second semiconductor chip, the first semiconductor chip being formed with a switching element configuring the upper arm and having first main electrodes on both sides in a first direction corresponding to a plate thickness direction of the first semiconductor chip, the second semiconductor chip being formed with a switching element configuring the lower arm and having second main electrodes on both sides in the first direction, the first semiconductor chip and the second semiconductor chip being aligned in a second direction orthogonal to the first direction;
a plurality of heat sinks including a pair of first heat sinks and a pair of second heat sinks, the pair of first heat sinks being disposed on opposite sides of the first semiconductor chip in the first direction and electrically connected to the corresponding first main electrodes, the pair of second heat sinks being disposed on opposite sides of the second semiconductor chip in the first direction and electrically connected to the corresponding second main electrodes;
a resin molded body integrally sealing the plurality of semiconductor chips and the plurality of heat sinks;
a plurality of main terminals projecting from one side surface of the resin molded body and being aligned in the second direction, the plurality of main terminals including a positive electrode terminal, a negative electrode terminal, an output terminal, and at least one auxiliary terminal, the positive electrode terminal being connected to the first heat sink on a high potential side, the negative electrode terminal connected to the second heat sink on a low potential side, the output terminal being connected to one of the first heat sink on a low potential side and the second heat sink on a high potential side;
a plurality of first relay members being disposed in the resin molded body, and electrically relaying the main terminals and the corresponding heat sinks; and
a second relay member being disposed in the resin molded body, and electrically relaying any one of the positive electrode terminal, the negative electrode terminal, and the output terminal to the auxiliary terminal, wherein the first heat sink on the low potential side and the second heat sink on the high potential side are electrically connected to each other, and of the positive electrode terminal, the negative electrode terminal, and the output terminal, a part of the main terminals is connected to the corresponding heat sink through the first relay member, the auxiliary terminal, and the second relay member, and the remaining main terminals are connected to the corresponding heat sinks through the first relay members without the auxiliary terminal.

2. The semiconductor device according to claim 1, wherein
the output terminal is connected to the corresponding heat sink through the first relay member, and
at least one of the positive electrode terminal and the negative electrode terminal is connected to the corresponding heat sink through the first relay member, the auxiliary terminal, and the second relay member.

3. The semiconductor device according to claim 1, wherein
the negative electrode terminal is disposed adjacent to the positive electrode terminal in the second direction.

4. The semiconductor device according to claim 1, wherein
in the first direction, the first relay member is connected to one surface of the main terminal, and the second relay member is connected to another surface of the main terminal opposite to the one surface, and
the first relay member and the second relay member are disposed so as to partially overlap with each other in a plan view viewed in the first direction.

5. The semiconductor device according to claim 1, wherein
the auxiliary terminal has a shorter projection length from the one side surface of the resin molded body than that of the other main terminals.

6. The semiconductor device according to claim 1, wherein
the second relay member is provided integrally with the main terminals that are to be electrically relayed.

7. A semiconductor device, which configures an upper and lower arm and to be electrically connected to a smoothing capacitor, the upper and lower arm having an upper arm and a lower arm connected in series to each other, the semiconductor device comprising:
a plurality of semiconductor chips including a first semiconductor chip and a second semiconductor chip, the first semiconductor chip being formed with a switching element configuring the upper arm and having first main electrodes on both sides in a first direction corresponding to a plate thickness direction of the first semiconductor chip, the second semiconductor chip being formed with a semiconductor element configuring the lower arm and having second main electrodes on both sides in the first direction, the first semiconductor chip and the second semiconductor chip being aligned in a second direction orthogonal to the first direction;
a plurality of heat sinks including a pair of first heat sinks and a pair of second heat sinks, the pair of first heat sinks being disposed on opposite sides of the first semiconductor chip in the plate thickness direction and electrically connected to the corresponding first main electrodes, the pair of second heat sinks being disposed on opposite sides of the second semiconductor chip in the plate thickness direction and electrically connected to the corresponding second main electrodes;
a resin molded body integrally sealing the plurality of semiconductor chips and the plurality of heat sinks;
a plurality of main terminals projecting from one side surface of the resin molded body and being aligned in the second direction, the plurality of main terminals including a positive electrode terminal, a negative electrode terminal, an output terminal, and an at least one auxiliary terminal, the positive electrode terminal being connected to the first heat sink on a high potential side, the negative electrode terminal being connected to the second heat sink on a low potential side, the output terminal being connected to the first heat sink on a low potential side and the second heat sink on a high potential side; and
a plurality of first relay members being disposed in the resin molded body, and electrically relaying the main terminals and the corresponding heat sinks, wherein
the first heat sink on the low potential side and the second heat sink on the high potential side are electrically connected to each other,
the negative electrode terminal is disposed adjacent to the positive electrode terminal in the second direction,
the output terminal is connected to the corresponding heat sink through the first relay member,
in a configuration where at least one of the positive electrode terminal and the negative electrode terminal is located farther than the auxiliary terminal with respect to the corresponding heat sink in a plan view viewed in the first direction, the at least one located farther than the auxiliary terminal is connected to the corresponding heat sink through the first relay member and the auxiliary terminal, and
in a configuration where a distance between the positive electrode terminal and the corresponding heat sink and a distance between the negative electrode terminal and the corresponding heat sink are each equal to or less than a distance between the auxiliary terminal and the respective corresponding heat sink in the plan view, the positive electrode terminal and the negative electrode terminal are connected to the corresponding heat sinks through the first relay members without through the auxiliary terminal.

* * * * *